US008545785B2

(12) United States Patent
Pan et al.

(10) Patent No.: US 8,545,785 B2
(45) Date of Patent: Oct. 1, 2013

(54) BARIUM FLUOROBORATE, NONLINEAR OPTICAL CRYSTAL OF BARIUM FLUOROBORATE, PREPARATION METHOD AND USE THEREOF

(75) Inventors: Shilie Pan, Urumqi (CN); Hongping Wu, Urumqi (CN); Xueling Hou, Urumqi (CN)

(73) Assignee: The XInjiang Technical Institute of Physics & Chemistry, Chinese Academy of Sciences (CN)

( * ) Notice: Subject to any disclaimer, the term of this patent is extended or adjusted under 35 U.S.C. 154(b) by 87 days.

(21) Appl. No.: 13/383,797

(22) PCT Filed: Jan. 12, 2011

(86) PCT No.: PCT/CN2011/000054
§ 371 (c)(1),
(2), (4) Date: Jan. 12, 2012

(87) PCT Pub. No.: WO2012/009945
PCT Pub. Date: Jan. 26, 2012

(65) Prior Publication Data
US 2012/0189524 A1 Jul. 26, 2012

(30) Foreign Application Priority Data
Jul. 20, 2010 (CN) .......................... 2010 1 0231415

(51) Int. Cl.
*C01B 35/10* (2006.01)
*G02B 26/02* (2006.01)

(52) U.S. Cl.
USPC .......................................... 423/277; 359/236

(58) Field of Classification Search
USPC ................ 423/277; 372/22, 10–17; 359/236
See application file for complete search history.

(56) References Cited

FOREIGN PATENT DOCUMENTS
CN        1085964 A      4/1997

OTHER PUBLICATIONS
Growth and Morphology of BaAlBO3F2 Crystals, Journal of the Chinese Ceramic Society, Aug. 2005, vol. 33, No. 8, I.I. Yunge, W.U. Yicheng, J.I. Lina, F.U. Peizhen, H.U. Zhanggui, Technical Institute of Physics and Chemistry, Chinese Academy of Sciences, Beijing 100080, Graduate School.

*Primary Examiner* — Steven Bos
*Assistant Examiner* — Justin Bova
(74) *Attorney, Agent, or Firm* — Barry L. Davison; Davis Wirght Tremaine LLP

(57) ABSTRACT

The present invention provides a barium fluoroborate compound, a nonlinear optical crystal and the preparation method and use thereof. Both of the barium fluoroborate compound and the nonlinear optical crystal have a chemical formula of $Ba_4B_{11}O_{20}F$. The crystal belongs to orthorhombic crystal system, has a space group $Cmc2_1$ with unit cell parameters of a=18.802(3) Å, b=10.7143(19) Å, c=8.6113(14) Å, V=1734.7(5) Å³. The crystal has a powder second harmonic generation efficiency of 10 times that of KDP ($KH_2PO_4$). The ultraviolet cutoff wavelength is about 170 nm. The barium fluoroborate compound is prepared by a solid-state reaction. The barium fluoroborate nonlinear optical crystal prepared by a high temperature melting liquid method has large hardness and is easy to be cut, polished and stored. This crystal can be used widely in preparing the nonlinear optical devices of the second harmonic generator, the up frequency converter, the down frequency converter or the optical parametric oscillator or the like.

12 Claims, 1 Drawing Sheet

BARIUM FLUOROBORATE, NONLINEAR OPTICAL CRYSTAL OF BARIUM FLUOROBORATE, PREPARATION METHOD AND USE THEREOF

This application is the United States National Phase of International Application PCT/CN2011/000054, filed Jan. 12, 2011. This application also includes a claim of priority to Chinese Application No. 20101023145.1 filed Jul. 20, 2010.

FIELD OF THE INVENTION

The present invention relates to a compound and a nonlinear optical crystal having a chemical formula of $Ba_4B_{11}O_{20}F$, the preparation method thereof and its uses in manufacturing nonlinear optical devices.

BACKGROUND OF THE INVENTION

Nonlinear optical devices of the second harmonic generator, the up/down frequency converter, or the optical parametric oscillator or the like can be manufactured by using the nonlinear optical effect of crystals. A laser produced from laser generator can be converted in its frequency by passing through a nonlinear optical device, whereby obtaining more lasers with useful wavelengths, allowing the laser generator finding wider applications. Among the nonlinear optical crystal materials, the halogen-containing nonlinear optical crystals are a kind of relatively special crystal materials. Because halogen ions have many similarities in coordination structures, their physical-chemical properties allow for avoiding a sudden change in the crystalline structure when the halogen ions replace with each other (partly or totally), and thus it is easy to achieve the modification of the materials.

At the same time, the focus topic has been put forth for the study and exploring of new nonlinear optical materials that exhibit high effect of second harmonic, broad transparent region, high damage threshold and stable physical-chemical properties. Currently, the main nonlinear optical materials include: BBO ($\beta$-$BaB_2O_4$), LBO ($LiB_3O_5$) crystal, CBO ($CsB_3O_5$) crystal, CLBO ($CsLiB_6O_{10}$) crystal and KBBF ($KBe_2BO_3F_2$) crystal. Although the crystal growing techniques for these materials have been developed increasingly, there are still apparent disadvantages, such as, deliquescence tendence of the crystals, long period of growing, serious behavior of growing in layers as well as high price. Accordingly, it is still an important and hard work to seek new nonlinear optical crystal materials.

In order to make up the shortages of the nonlinear optical crystals mentioned above, scientists all over the world are still focusing highly on the study and research of various novel nonlinear crystals. They pay attention to not only the optical properties and mechanical properties of the crystals, but also the preparing properties of the crystals more and more. In the case of finding a useful nonlinear optical crystal, a laser with limited wavelength can be converted to a laser with a new wavelength range by using the nonlinear optical effects of second harmonic, frequency mixing and optical parametric oscillating or the like. By using this technique, it is possible to fill up the gap in the spectrum range of the laser wavelengths irradiated by various laser devices, and allow for the laser generator finding a wider application.

SUMMARY OF THE INVENTION

One object of the present invention is to provide a barium fluoroborate compound having a chemical formula of $Ba_4B_{11}O_{20}F$, and a process for preparing the same.

Another object of the present invention is to provide a barium fluoroborate nonlinear optical crystal having a chemical formula of $Ba_4B_{11}O_{20}F$, and a process for preparing the same.

Yet another object of the present invention is to provide a use of the barium fluoroborate nonlinear optical device, and a use thereof for preparing the second harmonic generator, the up frequency converter, the down frequency converter or the optical parametric oscillator.

The technical solution of the present invention is as follows.

The barium fluoroborate compound provided by the present invention has a chemical formula of $Ba_4B_{11}O_{20}F$ and it is a barium fluoroborate compound prepared by a solid-state reaction according to the following chemical reactions:

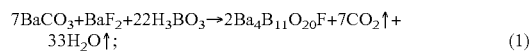  (1)

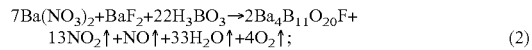  (2)

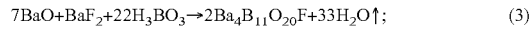  (3)

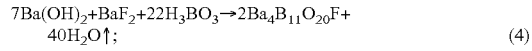  (4)

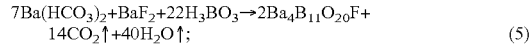  (5)

  (6)

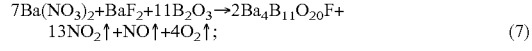  (7)

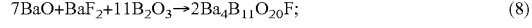  (8)

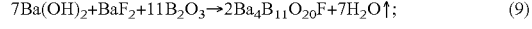  (9)

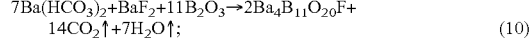  (10)

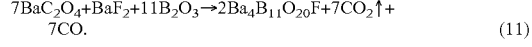  (11)

The barium fluoroborate nonlinear optical crystal provided by the present invention has a chemical formula of $Ba_4B_{11}O_{20}F$ and a molecular weight of 1007.27, wherein the crystal has no symmetric center, belongs to orthorhombic crystal system, has a space group $Cmc2_1$ with unit cell parameters of a=18.802(3) Å, b=10.7143(19) Å, c=8.6113(14) Å, Z=4, V=1734.7(5) Å$^3$. The crystal has a powder second harmonic generation efficiency of 10 times that of KDP ($KH_2PO_4$). The ultraviolet cutoff wavelength is about 170 nm.

The method for manufacturing the barium fluoroborate nonlinear optical crystal grows the barium fluoroborate nonlinear optical crystal by a high temperature melting liquid method through the steps of:

a. mixing a single-phase polycrystalline powder of a barium fluoroborate compound with a flux uniformly, heating the obtained mixture to 720~1050° C. at a temperature-increasing rate of 1~30° C./h, keeping the mixture at this temperature for 5~80 h to obtain a mixed melting liquid, and then reducing the temperature of the mixed melting liquid to 705~760° C., or weighing a starting material for preparing barium fluoroborate according to a molar ratio, mixing the starting material for preparing barium fluoroborate with a flux uniformly, heating the obtained mixture to 720~1050° C. at a temperature-increasing rate of 1~30° C./h, keeping the mixture at this temperature for 5~80 h to obtain a mixed melting liquid, and then reducing the temperature of the mixed melting liquid to 705~760° C.;

the flux is NaF, NaF—$H_3BO_3$, LiF—PbO, $H_3BO_3$—PbO, NaF—PbO or KF—PbO;

the starting material for preparing barium fluoroborate comprises a barium-containing compound, barium fluoride, boric acid in a molar ratio of 7:1:22; or comprises a barium-containing compound, barium fluoride, boron oxide in a molar ratio of 7:1:11;

the barium-containing compound is barium carbonate, barium nitrate, barium oxide, barium hydroxide, barium bicarbonate or barium oxalate;

the single-phase polycrystalline powder of the barium fluoroborate compound is prepared by a solid-state reaction with the steps of subjecting the above starting material to: uniformly mixing, grinding, heating at 550° C. for 24 hours in a muffle furnace, cooling to room temperature; the second grinding, heating at 650° C. for 24 hours in a muffle furnace, cooling to room temperature; the third grinding, heating at 750° C. for 48 hours in a muffle furnace, removing and grinding so as to obtain a completely sintered single-phase polycrystalline powder of the barium fluoroborate compound;

the molar ratio of the barium fluoroborate to the flux is 1:3~10;

b. preparing a barium fluoroborate seed crystal: a part of the mixed melting liquid as obtained in step a is slowly cooled to room temperature at a rate of 0.5~10° C./h to obtain a barium fluoroborate seed crystal by spontaneous crystallization;

c. placing a crucible containing the mixed melting liquid as obtained in step a into a crystal growing furnace, attaching the seed crystal as obtained in step b on a seed crystal rod for introducing the seed crystal into the crystal growing furnace from the top thereof, preheating the seed crystal for 5-60 minutes, introducing the seed crystal to contact the liquid surface of the mixed melting liquid or into the mixed melting liquid for remelting, keeping the temperature of the mixture for 5~60 minutes, and reducing the temperature to reach a saturation temperature at a ratio of 1~10° C./h;

d. reducing the temperature of the mixture at a rate of 0.1~5° C./day while rotating the seed crystal rod at a rate of 0~60 rpm for growing crystal, drawing the crystal out of the surface of the mixed melting liquid when a single crystal has obtained the desired size, reducing the temperature of the crystal to room temperature at a rate of 1~80° C./h, and removing the crystal from the furnace to obtain a barium fluoroborate nonlinear optical crystal.

In the flux of NaF—$H_3BO_3$, the molar ratio of NaF to $H_3BO_3$ is 1~8:1~5; and in the flux of $H_3BO_3$—PbO, the molar ratio of $H_3BO_3$ to PbO is 1~6:1~5.

In the fluxes of LiF—PbO, NaF—PbO or KF—PbO, the molar ratio of the fluoride to lead oxide is 2~5:1~3.

The barium fluoroborate nonlinear optical crystal prepared in the present invention has a chemical formula of $Ba_4B_{11}O_{20}F$ and a molecular weight of 1007.27, belongs to orthorhombic crystal system, has a space group $Cmc2_1$ with unit cell parameters of a=18.802(3) Å, b=10.7143(19) Å, c=8.6113(14) Å, V=1734.7(5) Å$^3$. The crystal has a powder second harmonic generation efficiency of about 10 times that of KDP ($KH_2PO_4$). The ultraviolet cutoff wavelength is about 170 nm.

Because the use of fluxes NaF, NaF—$H_3BO_3$, LiF—PbO, NaF—PbO, $H_3BO_3$—PbO or KF—PbO in the growing of the barium fluoroborate nonlinear optical crystal, the product has a high purity, is easy to grow up and transparent without wrapping, it possess the advantages of relatively high growing speed, low cost and easy to obtain larger size crystal, or the like. The obtained crystal has the advantages of relatively broad transparent region, large hardness, good mechanical properties, hard to be broken and deliquesced, easy to be processed and stored. At room temperature, when a Q-switched Nd:YAG laser generator is used as the light source and the incident infrared light has a wavelength of 1064 nm, a nonlinear optical device manufactured by using the present barium fluoroborate nonlinear optical crystal will generate a green laser with a wavelength of 532 nm which has an intensity of 10 times that of KDP ($KH_2PO_4$).

DETAILED DESCRIPTION OF THE INVENTION

Figure 1:
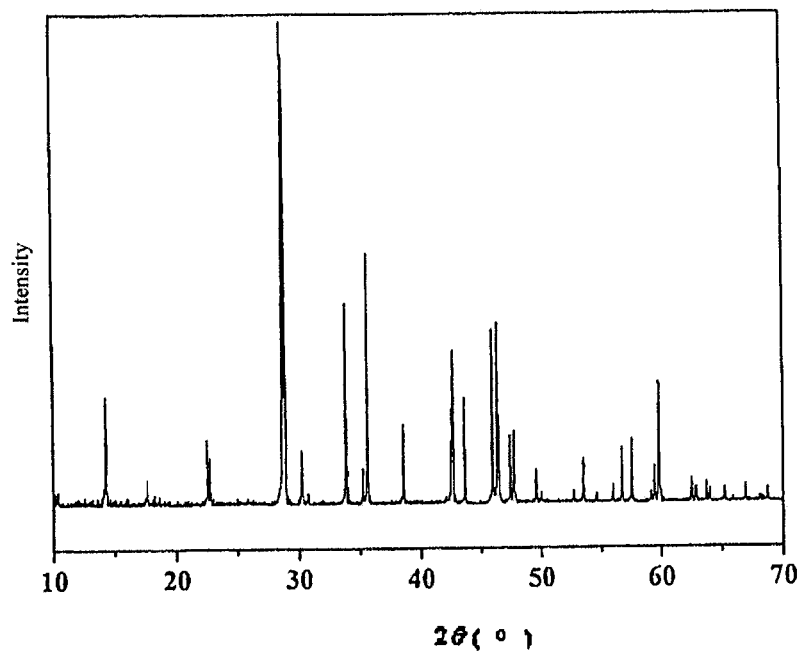
FIG. 1 shows the X-ray diffraction pattern of $Ba_4B_{11}O_{20}F$ powders of the invention.

The present invention will be described in detail with reference to the drawings and examples below:

EXAMPLE 1

Preparation of a $Ba_4B_{11}O_{20}F$ compound according to the following reaction equation:

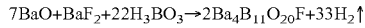

$$7BaO+BaF_2+22H_3BO_3 \rightarrow 2Ba_4B_{11}O_{20}F+33H_2\uparrow$$

BaO, $BaF_2$ and $H_3BO_3$ were put in a mortar at a molar ratio of 7/2:1/2:11, mixed and ground carefully, and then charged into a Φ100 mm×100 mm lidless corundum crucible. The crucible was placed in a muffle furnace, heated slowly to 550° C. and held at this temperature for 24 hours. After cooling to room temperature, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained barium fluoroborate $Ba_4B_{11}O_{20}F$ compound single-phase polycrystalline powder and a flux NaF were mixed at a molar ratio of $Ba_4B_{11}O_{20}F$:NaF=1:3, and then charged into a Φ80 mm×80 mm lidless platinum crucible. The obtain mixture was heated to 780° C. at a temperature-increasing rate of 30° C./h and kept at this temperature for 15 h to obtain a mixed melting liquid. Subsequently, the temperature was reduced to 735° C.

The temperature was slowly reduced to room temperature at a rate of 0.5° C./h to obtain a barium fluoroborate seed crystal by spontaneous crystallization.

Growing crystal in the compound melting liquid: the obtained $Ba_4B_{11}O_{20}F$ seed crystal was attached on a seed crystal rod for introducing the seed crystal into the crystal growing furnace from the top thereof The seed crystal was preheated above the melting liquid surface for 10 minutes, and then dipped into the liquid surface so that the seed crystal remelted in the mixed melting liquid. The temperature was kept for 30 minutes, and then reduced to a saturation temperature of 730° C. at a rate of 10° C./h.

Temperature was further reduced at a rate of 2° C./day while rotating the seed crystal rod at a rate of 10 rpm. The crystal was drawn out of the surface of the mixed melting liquid when the crystal had completed its growing. The temperature of the crystal was reduced to room temperature at a rate of 10° C./h to obtain a $Ba_4B_{11}O_{20}F$ crystal with a size of 56 mm×40 mm×30 mm.

In the above reaction equation, the starting material barium oxide can be replaced by barium carbonate, barium nitrate, barium oxalate, barium hydroxide or barium bicarbonate; the boronic acid can be replaced by boron oxide.

EXAMPLE 2

Preparation of a $Ba_4B_{11}O_{20}F$ compound according to the following reaction equation:

$$7Ba(NO_3)_2 + BaF_2 + 22H_3BO_3 \rightarrow 2Ba_4B_{11}O_{20}F + 13NO_2\uparrow + NO\uparrow + 33H_2O\uparrow + 4O_2\uparrow$$

$Ba(NO_3)_2$, $BaF_2$ and $H_3BO_3$ were weighed at a molar ratio of 7/2:1/2:11 directly as starting materials. The weighed starting materials and a flux KF—PbO in which the molar ratio of KF to PbO is 2:1 were mixed at a molar ratio of 1:4, and then charged into a Φ80 mm×80 mm lidless platinum crucible. The obtain mixture was heated to 745° C. and kept at this temperature for 5 h to obtain a mixed melting liquid. Subsequently, the temperature was reduced to 715° C.

The temperature was slowly reduced to room temperature at a rate of 1.5° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 10 minutes, and then dipped into the liquid surface so that the seed crystal remelted in the mixed melting liquid. The temperature was kept for 30 minutes, and reduced quickly to a saturation temperature of 710° C.

Temperature was further reduced at a rate of 1° C./day without rotating the seed crystal rod. The crystal was drawn out of the surface of the mixed melting liquid when the crystal had grown to the desired size. The temperature of the crystal was reduced to room temperature at a rate of 20° C./h followed by removing the crystal from the furnace to obtain a $Ba_4B_{11}O_{20}F$ crystal with a size of 36 mm×20 mm×18 mm.

In the above reaction equation, the starting material barium nitrate can be replaced by barium carbonate, barium oxide, barium oxalate, barium hydroxide or barium bicarbonate; the boronic acid can be replaced by boron oxide.

EXAMPLE 3

Preparation of a $Ba_4B_{11}O_{20}F$ compound according to the following reaction equation:

$$7BaCO_3 + BaF_2 + 22H_3BO_3 \rightarrow 2Ba_4B_{11}O_{20}F + 7CO_2\uparrow + 33H_2O\uparrow$$

$BaCO_3$, $BaF_2$ and $H_3BO_3$ were put in a mortar at a molar ratio of 7/2:1/2:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling to room temperature, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained $Ba_4B_{11}O_{20}F$ compound and a flux NaF were mixed at a molar ratio of $Ba_4B_{11}O_{20}F$:NaF=1:5, and then charged into a Φ80 mm×80 mm lidless platinum crucible.

The obtain mixture was heated to 760° C. and kept at this temperature for 10 h to obtain a mixed melting liquid. Subsequently, the temperature was reduced to 730° C.

The temperature was slowly reduced to room temperature at a rate of 2.5° C./h to obtain a barium fluoroborate seed crystal by spontaneous crystallization.

The obtained seed crystal was attached on a seed crystal rod for introducing seed crystal into the crystal growing furnace from the top thereof. The seed crystal was preheated above the melting liquid surface for 10 minutes, and then partly dipped into the liquid surface so that the seed crystal remelted in the mixed melting liquid. The temperature was kept for 20 minutes, and reduced quickly to a saturation temperature of 720° C.

Temperature was further reduced at a rate of 2° C./day while rotating the seed crystal rod at a rate of 30 rpm. The crystal was drawn out of the surface of the mixed melting liquid when the crystal had grown to the desired size. The temperature of the crystal was reduced to room temperature at a rate of 30° C./h followed by removing the crystal from the furnace to obtain a $Ba_4B_{11}O_{20}F$ crystal with a size of 36 mm×40 mm×30 mm.

In the above reaction equation, the starting material barium carbonate can be replaced by barium oxide, barium nitrate, barium oxalate, barium hydroxide or barium bicarbonate; the boronic acid can be replaced by boron oxide.

EXAMPLE 4

Preparation of a $Ba_4B_{11}O_{20}F$ compound according to the following reaction equation:

$$7Ba(OH)_2 + BaF_2 + 22H_3BO_3 \rightarrow 2Ba_4B_{11}O_{20}F + 40H_2O\uparrow$$

$Ba(OH)_2$, $BaF_2$ and $H_3BO_3$ were put in a mortar at a molar ratio of 7/2:1/2:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling to room temperature, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained $Ba_4B_{11}O_{20}F$ compound and a flux KF—PbO in which the molar ratio of KF to PbO is 1:1 were mixed at a molar ratio of 1:7, and then charged into a Φ80 mm×80 mm lidless platinum crucible. The obtain mixture was heated to 720° C. and kept at this temperature for 30 h to obtain a mixed melting liquid. Subsequently, the temperature was reduced to 705° C.

The temperature was slowly reduced to room temperature at a rate of 2.5° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 5 minutes, and then dipped into the liquid surface so that the seed crystal remelted in the mixed melting liquid. The temperature was kept for 5 minutes, and reduced quickly to a saturation temperature of 700° C.

Temperature was further reduced at a rate of 2° C./day while rotating the seed crystal rod at a rate of 50 rpm. The crystal was drawn out of the surface of the mixed melting liquid when the crystal had grown to the desired size. The temperature of the crystal was reduced to room temperature at a rate of 60° C./h followed by removing the crystal from the furnace to obtain a $Ba_4B_{11}O_{20}F$ crystal with a size of 32 mm×42 mm×16 mm.

In the above reaction equation, the starting material barium hydroxide can be replaced by barium carbonate, barium nitrate, barium oxalate, barium oxide or barium bicarbonate; the boronic acid can be replaced by boron oxide.

EXAMPLE 5

Preparation of a $Ba_4B_{11}O_{20}F$ compound according to the following reaction equation:

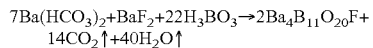
$$7Ba(HCO_3)_2+BaF_2+22H_3BO_3 \rightarrow 2Ba_4B_{11}O_{20}F+14CO_2\uparrow+40H_2O\uparrow$$

$Ba(HCO_3)_2$, $BaF_2$ and $H_3BO_3$ were weighed at a molar ratio of 7/2:1/2:11 directly as starting materials. The weighed starting materials and a flux LiF—PbO in which the molar ratio of LiF to PbO is 3:1 were mixed at a molar ratio of 1:8, and then charged into a Φ80 mm×80 mm lidless platinum crucible. The obtain mixture was heated to 800° C. and kept at this temperature for 60 h to obtain a mixed melting liquid. Subsequently, the temperature was reduced to 760° C.

The temperature was slowly reduced to room temperature at a rate of 3.5° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 15 minutes, and then dipped into the liquid surface so that the seed crystal remelted in the mixed melting liquid. The temperature was kept for 30 minutes, and reduced quickly to a saturation temperature of 755° C.

Temperature was further reduced at a rate of 3□/day while rotating the seed crystal or the crucible at a rate of 5 rpm. The crystal was drawn out of the surface of the mixed melting liquid when the crystal had grown to the desired size. The temperature of the crystal was reduced to room temperature at a rate of 1° C./h followed by removing the crystal from the furnace to obtain a $Ba_4B_{11}O_{20}F$ crystal with a size of 35 mm×25 mm×10 mm.

In the above reaction equation, the starting material barium bicarbonate can be replaced by barium carbonate, barium nitrate, barium oxalate, barium hydroxide or barium oxide; the boronic acid can be replaced by boron oxide.

EXAMPLE 6

Preparation of a $Ba_4B_{11}O_{20}F$ compound according to the following reaction equation:

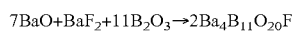
$$7BaO+BaF_2+11B_2O_3 \rightarrow 2Ba_4B_{11}O_{20}F$$

BaO, $BaF_2$ and $B_2O_3$ were weighed at a molar ratio of 7:1:11 directly as starting materials. The weighed starting materials and a flux NaF—PbO in which the molar ratio of NaF to PbO is 3:2 were mixed at a molar ratio of 1:6, and then charged into a Φ80 mm×80 mm lidless platinum crucible. The obtain mixture was heated to 760° C. and kept at this temperature for 60 h to obtain a mixed melting liquid. Subsequently, the temperature was reduced to 725° C.

The temperature was slowly reduced to room temperature at a rate of 5° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 20 minutes, and then dipped into the liquid surface so that the seed crystal remelted in the mixed melting liquid. The temperature was kept for 5 minutes, and reduced quickly to a saturation temperature of 715° C.

Temperature was further reduced at a rate of 3° C./day while rotating the seed crystal rod at a rate of 15 rpm. The crystal was drawn out of the surface of the mixed melting liquid when the crystal had grown to the desired size. The temperature of the crystal was reduced to room temperature at a rate of 15° C./h followed by removing the crystal from the furnace to obtain a $Ba_4B_{11}O_{20}F$ crystal with a size of 35 mm×25 mm×20 mm.

In the above reaction equation, the starting material barium oxide can be replaced by barium carbonate, barium nitrate, barium oxalate, barium hydroxide or barium bicarbonate; the boron oxide can be replaced by boronic acid.

EXAMPLE 7

Preparation of a $Ba_4B_{11}O_{20}F$ compound according to the following reaction equation:

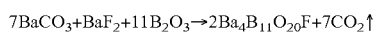
$$7BaCO_3+BaF_2+11B_2O_3 \rightarrow 2Ba_4B_{11}O_{20}F+7CO_2\uparrow$$

$BaCO_3$, $BaF_2$ and $B_2O_3$ were weighed at a molar ratio of 7:1:11 directly as starting materials. The weighed starting materials and a flux NaF—$H_3BO_3$ in which the molar ratio of NaF to $H_3BO_3$ is 5:3 were mixed at a molar ratio of 1:5, and then charged into a Φ80 mm×80 mm lidless platinum crucible. The obtain mixture was heated to 760° C. and kept at this temperature for 80 h to obtain a mixed melting liquid. Subsequently, the temperature was reduced to 730° C.

The temperature was slowly reduced to room temperature at a rate of 10° C./h to obtain a barium fluoroborate seed crystal by spontaneous crystallization.

The obtained seed crystal was attached on a seed crystal rod for introducing the seed crystal into the crystal growing furnace from the top thereof. The seed crystal was preheated above the melting liquid surface for 25 minutes, and then partly dipped into the liquid surface so that the seed crystal remelted in the mixed melting liquid. The temperature was kept for 25 minutes, and reduced quickly to a saturation temperature of 720° C.

Temperature was further reduced at a rate of 5° C./day while rotating the seed crystal rod at a rate of 30 rpm. The crystal was drawn out of the surface of the mixed melting liquid when the crystal had grown to the desired size. The temperature of the crystal was reduced to room temperature at a rate of 35° C./h followed by removing the crystal from the furnace to obtain a $Ba_4B_{11}O_{20}F$ crystal with a size of 26 mm×35 mm×20 mm.

In the above reaction equation, the starting material barium carbonate can be replaced by barium bicarbonate, barium nitrate, barium oxalate, barium hydroxide or barium oxide; the boron oxide can be replaced by boronic acid.

EXAMPLE 8

Preparation of a $Ba_4B_{11}O_{20}F$ compound according to the following reaction equation:

$$7Ba(NO_3)_2 + BaF_2 + 11B_2O_3 \rightarrow 2Ba_4B_{11}O_{20}F + 13NO_2\uparrow + NO\uparrow + 4O_2\uparrow$$

$Ba(NO_3)_2$, $BaF_2$ and $B_2O_3$ were put in a mortar at a molar ratio of 7:1:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained $Ba_4B_{11}O_{20}F$ compound and a flux KF—PbO in which the molar ratio of KF to PbO is 2:1 were mixed at a molar ratio of 1:4, and then charged into a Φ80 mm×80 mm lidless platinum crucible. The obtain mixture was heated to 850° C. and kept at this temperature for 70 h to obtain a mixed melting liquid. Subsequently, the temperature was reduced to 725° C.

The temperature was slowly reduced to room temperature at a rate of 4.0° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 8 minutes, and then dipped into the liquid surface so that the seed crystal remelted in the mixed melting liquid. The temperature was kept for 8 minutes, and reduced quickly to a saturation temperature of 720° C.

Temperature was further reduced at a rate of 0.8° C./day while rotating the seed crystal rod at a rate of 10 rpm. The crystal was drawn out of the surface of the mixed melting liquid when the crystal had grown to the desired size. The temperature of the crystal was reduced to room temperature at a rate of 5° C./h followed by removing the sample from the furnace to obtain a $Ba_4B_{11}O_{20}F$ crystal with a size of 16 mm×25 mm×18 mm.

In the above reaction equation, the starting material barium nitrate can be replaced by barium carbonate, barium bicarbonate, barium oxalate, barium hydroxide or barium oxide; the boron oxide can be replaced by boronic acid.

EXAMPLE 9

Preparation of a $Ba_4B_{11}O_{20}F$ compound according to the following reaction equation:

$$7Ba(OH)_2 + BaF_2 + 11B_2O_3 \rightarrow 2Ba_4B_{11}O_{20}F + 7H_2O\uparrow$$

$Ba(OH)_2$, $BaF_2$ and $B_2O_3$ were put in a mortar at a molar ratio of 7:1:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained $Ba_4B_{11}O_{20}F$ compound and a flux LiF—PbO in which the molar ratio of LiF to PbO is 5:1 were mixed at a molar ratio of 1:10, and then charged into a Φ80 mm×80 mm lidless platinum crucible. The obtain mixture was heated to 850° C. and kept at this temperature for 45 h to obtain a mixed melting liquid. Subsequently, the temperature was reduced to 750° C.

The temperature was slowly reduced to room temperature at a rate of 6.5° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 15 minutes, and then dipped into the liquid surface so that the seed crystal remelted in the mixed melting liquid. The temperature was kept for 15 minutes, and reduced quickly to a saturation temperature of 740° C.

Temperature was further reduced at a rate of 2° C./day while rotating the seed crystal rod at a rate of 60 rpm. The crystal was drawn out of the surface of the mixed melting liquid when the crystal had grown to the desired size. The temperature of the crystal was reduced to room temperature at a rate of 80° C./h followed by removing the sample from the furnace to obtain a $Ba_4B_{11}O_{20}F$ crystal with a size of 22 mm×32 mm×16 mm.

In the above reaction equation, the starting material barium hydroxide can be replaced by barium carbonate, barium bicarbonate, barium oxalate, barium nitrate or barium oxide; the boron oxide can be replaced by boronic acid.

EXAMPLE 10

Preparation of a $Ba_4B_{11}O_{20}F$ compound according to the following reaction equation:

$$7Ba(HCO_3)_2 + BaF_2 + 11B_2O_3 \rightarrow 2Ba_4B_{11}O_{20}F + 14CO_2\uparrow + 7H_2O\uparrow$$

$Ba(HCO_3)_2$, $BaF_2$ and $B_2O_3$ were put in a mortar at a molar ratio of 7:1:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure. The obtained $Ba_4B_{11}$ $O_{20}F$ compound and a flux NaF—PbO in which the molar ratio of NaF to PbO is 2:3 were mixed at a molar ratio of 1:6, and then charged into a Φ80 mm×80 mm lidless platinum crucible. The obtain mixture was heated to 950° C. and kept at this temperature for 70 h to obtain a mixed melting liquid. Subsequently, the temperature was reduced to 750° C.

The temperature was slowly reduced to room temperature at a rate of 4.0° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 20 minutes, and then dipped into the liquid surface so that the seed crystal remelted in the mixed melting liquid. The temperature was kept for 25 minutes, and reduced quickly to a saturation temperature of 745° C.

Temperature was further reduced at a rate of 3° C./day while rotating the seed crystal rod at a rate of 50 rpm. The crystal was drawn out of the surface of the mixed melting liquid when the crystal had grown to the desired size. The temperature of the crystal was reduced to room temperature at a rate of 70° C./h followed by removing the sample from the furnace to obtain a $Ba_4B_{11}O_{20}F$ crystal with a size of 25 mm×25 mm×18 mm.

In the above reaction equation, the starting material barium bicarbonate can be replaced by barium carbonate, barium hydroxide, barium oxalate, barium nitrate or barium oxide; the boron oxide can be replaced by boronic acid.

EXAMPLE 11

Preparation of a $Ba_4B_{11}O_{20}F$ compound according to the following reaction equation:

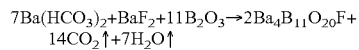
$$7Ba(HCO_3)_2 + BaF_2 + 11B_2O_3 \rightarrow 2Ba_4B_{11}O_{20}F + 14CO_2\uparrow + 7H_2O\uparrow$$

$Ba(HCO_3)_2$, $BaF_2$ and $B_2O_3$ were put in a mortar at a molar ratio of 7:1:11, mixed and ground carefully, and then charged into a Φ100 mm×100 mm lidless corundum crucible and compacted. The crucible was placed in a muffle furnace, heated slowly to 550° C. and held at this temperature for 24 hours. After cooling, the crucible was taken out and at which time the sample was relatively loose. Subsequently, the sample was removed and ground thoroughly again. Then the sample was charged into a crucible again and heated to 750° C. in the muffle furnace and held for 48 h. The sample was then removed and ground in a mortar to yield a $Ba_4B_{11}O_{20}F$ compound. The product was subjected to X-ray analysis, and the resultant X-ray pattern was consistent with the X-ray pattern obtained from barium fluoroborate $Ba_4B_{11}O_{20}F$ single crystal structure.

The obtained $Ba_4B_{11}O_{20}F$ compound and a flux $H_3BO_3$—PbO in which the molar ratio of $H_3BO_3$ to PbO is 5:4 were mixed at a molar ratio of 1:3, and then charged into a Φ180 mm×80 mm lidless platinum crucible. The obtain mixture was heated to 800° C. and kept at this temperature for 50 h to obtain a mixed melting liquid. Subsequently, the temperature was reduced to 720° C.

The temperature was slowly reduced to room temperature at a rate of 4.0° C./h to obtain a barium fluoroborate seed crystal by spontaneous crystallization.

The obtained $Ba_4B_{11}O_{20}F$ seed crystal was attached on a seed crystal rod for introducing the seed crystal into the crystal growing furnace from the top thereof. The seed crystal was preheated above the melting liquid surface for 20 minutes, and then dipped into the liquid surface so that the seed crystal remelted in the mixed melting liquid. The temperature was kept for 25 minutes, and reduced quickly to a saturation temperature of 715° C.

Temperature was further reduced at a rate of 2° C./day while rotating the seed crystal rod at a rate of 28 rpm. The crystal was drawn out of the surface of the mixed melting liquid when the crystal had grown to the desired size. The temperature of the crystal was reduced to room temperature at a rate of 25° C./h followed by removing the sample from the furnace to obtain a $Ba_4B_{11}O_{20}F$ crystal with a size of 31 mm×26 mm×18 mm.

In the above reaction equation, the starting material barium bicarbonate can be replaced by barium carbonate, barium hydroxide, barium oxalate, barium nitrate or barium oxide; the boron oxide can be replaced by boronic acid.

EXAMPLE 12

Preparation of a $Ba_4B_{11}O_{20}F$ compound according to the following reaction equation:

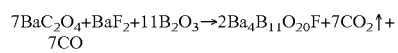
$$7BaC_2O_4 + BaF_2 + 11B_2O_3 \rightarrow 2Ba_4B_{11}O_{20}F + 7CO_2\uparrow + 7CO$$

$BaC_2O_4$, $BaF_2$ and $B_2O_3$ were weighed at a molar ratio of 7:1:11 directly as starting materials. The weighed starting materials and a flux PbO—$H_3BO_3$ in which the molar ratio of PbO to $H_3BO_3$ is 5:3 were mixed at a molar ratio of 1:5, and then charged into a Φ80 mm×80 mm lidless platinum crucible. The obtain mixture was heated to 720° C. and kept at this temperature for 80 h to obtain a mixed melting liquid. Subsequently, the temperature was reduced to 690° C.

The temperature was slowly reduced to room temperature at a rate of 2° C./h to obtain a barium fluoroborate seed crystal by spontaneous crystallization.

The obtained seed crystal was attached on a seed crystal rod for introducing the seed crystal into the crystal growing furnace from the top thereof. The seed crystal was preheated above the melting liquid surface for 25 minutes, and then partly dipped into the liquid surface so that the seed crystal remelted in the mixed melting liquid. The temperature was kept for 25 minutes, and reduced quickly to a saturation temperature 680° C.

Temperature was further reduced at a rate of 5° C./day while rotating the seed crystal rod at a rate of 30 rpm. The crystal was drawn out of the surface of the mixed melting liquid when the crystal had grown to the desired size. The temperature of the crystal was reduced to room temperature at a rate of 20° C./h followed by removing the crystal from the furnace to obtain a $Ba_4B_{11}O_{20}F$ crystal with a size of 25 mm×22 mm×20 mm.

In the above reaction equation, the starting material barium oxalate can be replaced by barium bicarbonate, barium nitrate, barium carbonate, barium hydroxide or barium oxide; the boron oxide can be replaced by boronic acid.

EXAMPLE 13

Figure 2:
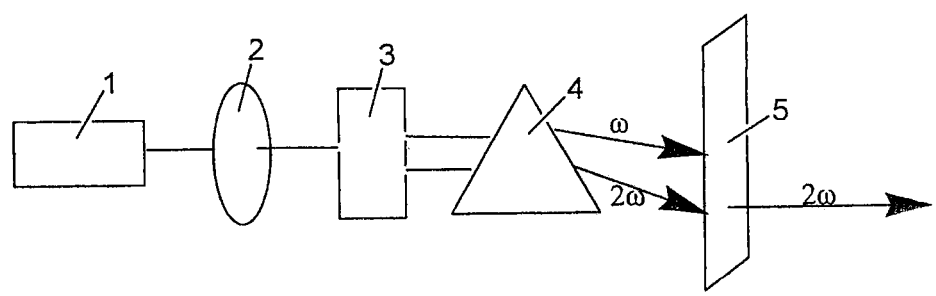
FIG. 2 is a schematic illustration of the processing principle of a nonlinear optical device made from the present barium fluoroborate nonlinear optical crystal, wherein, 1 is a laser generator, 2 is an emitted laser beam, 3 is a $Ba_4B_{11}O_{20}F$ crystal, 4 is an output beam, and 5 is a filter.

A $Ba_4B_{11}O_{20}F$ crystal obtained in any one of Examples 1-12 was processed into a second harmonic device with a size of 5 mm×5 mm×6 mm according to the phase-matching orientation, and disposed at position 3 as shown in FIG. 2. At room temperature, when Q-switched Nd:YAG laser generator was used as the light source and the incident light had a wavelength of 1064 nm, an infrared light beam 2 with a wavelength of 1064 nm generated by the Q-switched Nd:YAG laser generator 1 irradiated into the $Ba_4B_{11}O_{20}F$ single crystal 3, resulting in a green second harmonic light with a wavelength of 532 nm which has an output intensity of 10 times that of KDP under the same condition. The output light beam 4 contained an infrared light with a wavelength of 1064 nm and a green light with a wavelength of 532 nm, and it was filtered by filter 5 to obtain a green laser with a wavelength of 532 nm.

What is claimed is:

1. A barium fluoroborate compound having a chemical formula of $Ba_4B_{11}O_{20}F$.

2. A process for preparing a barium fluoroborate compound having a chemical formula of $Ba_4B_{11}O_{20}F$, comprising at least one solid-state chemical reaction selected from the group consisting of:

$$7BaCO_3 + BaF_2 + 22H_3BO_3 \rightarrow 2Ba_4B_{11}O_{20}F + 7CO_2\uparrow + 33H_2O\uparrow; \quad (1)$$

$$7Ba(NO_3)_2 + BaF_2 + 22H_3BO_3 \rightarrow 2Ba_4B_{11}O_{20}F + 13NO_2\uparrow + NO\uparrow + 33H_2O\uparrow + 4O_2\uparrow; \quad (2)$$

$$7BaO + BaF_2 + 22H_3BO_3 \rightarrow 2Ba_4B_{11}O_{20}F + 33H_2O\uparrow; \quad (3)$$

$$7Ba(OH)_2 + BaF_2 + 22H_3BO_3 \rightarrow 2Ba_4B_{11}O_{20}F + 40H_2O\uparrow; \quad (4)$$

$$7Ba(HCO_3)_2 + BaF_2 + 22H_3BO_3 \rightarrow 2Ba_4B_{11}O_{20}F + 14CO_2\uparrow + 40H_2O\uparrow; \quad (5)$$

$$7BaCO_3 + BaF_2 + 11B_2O_3 \rightarrow 2Ba_4B_{11}O_{20}F + 7CO_2\uparrow; \quad (6)$$

$$7Ba(NO_3)_2 + BaF_2 + 11B_2O_3 \rightarrow 2Ba_4B_{11}O_{20}F + 13NO_2\uparrow + NO\uparrow + 4O_2\uparrow; \quad (7)$$

$$7BaO + BaF_2 + 11B_2O_3 \rightarrow 2Ba_4B_{11}O_{20}F; \quad (8)$$

$$7Ba(OH)_2 + BaF_2 + 11B_2O_3 \rightarrow 2Ba_4B_{11}O_{20}F + 7H_2O\uparrow; \quad (9)$$

$$7Ba(HCO_3)_2 + BaF_2 + 11B_2O_3 \rightarrow 2Ba_4B_{11}O_{20}F + 14CO_2\uparrow + 7H_2O\uparrow; \quad (10)$$

$$7BaC_2O_4 + BaF_2 + 11B_2O_3 \rightarrow 2Ba_4B_{11}O_{20}F + 7CO_2\uparrow + 7CO. \quad (11)$$

3. A barium fluoroborate nonlinear optical crystal having a chemical formula of $Ba_4B_{11}O_{20}F$.

4. A method for manufacturing a barium fluoroborate nonlinear optical crystal, comprising:

a. preparing a mixed melting liquid using at least one method selected from the group consisting of:

mixing a single-phase polycrystalline powder of a barium fluoroborate compound with a flux uniformly wherein the molar ratio of the single-phase polycrystalline powder of the barium fluoroborate compound to the flux is in the range of 1:3-1:10, heating the obtained mixture to a first temperature in the range of 720-1050° C. at a temperature-increasing rate in the range of 1-30° C./h, keeping the mixture at the first temperature for a time period in the range of 5-80 h to obtain a mixed melting liquid, and then reducing the temperature of the mixed melting liquid to a second temperature in the range of 705-760° C., wherein the first temperature is higher than the second temperature, weighing and mixing uniformly a barium containing compound, barium fluoride, boric acid and a flux directly wherein the molar ratio of the barium containing compound, the barium fluoride, the boric acid and the flux is 7:1:22:3-10, respectively, heating the obtained mixture to a first temperature in the range of 720-1050° C. at a temperature-increasing rate in the range of 1-30° C./h, keeping the mixture at this temperature for a time period in the range of 5-80 h to obtain a mixed melting liquid, and then reducing the temperature of the mixed melting liquid to a second temperature in the range of 705-760° C., wherein the first temperature is higher than the second temperature, wherein the barium containing compound comprises at least one compound selected from the group consisting of barium carbonate, barium nitrate, barium oxide, barium hydroxide, barium bicarbonate and barium oxalate, and wherein the flux comprises at least one compound selected from the group consisting of NaF, NaF—$H_3BO_3$, LiF—PbO, $H_3BO_3$—PbO, NaF—PbO and KF—PbO, and weighing and mixing uniformly a barium containing compound, barium fluoride, boric oxide and a flux directly wherein the molar ratio of the barium containing compound, the barium fluoride, the boric oxide and the flux is 7:1:11:3-10, respectively, heating the obtained mixture to a first temperature in the range of 720 to 1050° C. at a temperature-increasing rate in the range of 1-30° C./h, keeping the mixture at this temperature for a time period in the range of 5-80 h to obtain a mixed melting liquid, and then reducing the temperature of the mixed melting liquid to a second temperature in the range of 705-760° C., wherein the first temperature is higher than the second temperature, wherein the barium containing compound comprises at least one compound selected from the group consisting of barium carbonate, barium nitrate, barium oxide, barium hydroxide, barium bicarbonate and barium oxalate, and wherein the flux comprises at least one compound selected from the group consisting of NaF, NaF—$H_3BO_3$, LiF—PbO, $H_3BO_3$—PbO, NaF—PbO and KF—PbO;

b. preparing a barium fluoroborate seed crystal by cooling a part of the mixed melting liquid as obtained in step a to room temperature at a cooling rate in the range of 0.5-10° C./h to obtain a barium fluoroborate seed crystal by spontaneous crystallization;

c. placing a crucible containing the mixed melting liquid as obtained in step a into a crystal growing furnace, attaching the barium fluoroborate seed crystal as obtained in step b on a seed crystal rod for introducing the seed crystal into the crystal growing furnace, preheating the seed crystal for a time period in the range of 5-60 minutes, introducing the seed crystal to contact the liquid surface of the mixed melting liquid and/or into the mixed melting liquid for remelting, keeping the temperature of the mixture for a time period in the range of 5-60 minutes, and reducing the temperature to reach a saturation temperature at a cooling rate in the range of 1-60° C./h; and d. further reducing the temperature of the mixture of step c at a cooling rate in the range of 0.1-5° C./day while rotating the seed crystal rod at a rate in the range of 0-60 rpm for growing crystal, drawing the crystal out of the surface of the mixed melting liquid when the crystal has obtained a desired size, reducing the temperature of the crystal to room temperature at a cooling rate in the range of 1-80° C./h, and removing the crystal from the furnace to obtain a barium fluoroborate nonlinear optical crystal, wherein the barium flouroborate nonlinear optical crystal has the chemical formula of $Ba_4B_{11}O_{20}F$.

5. The method for manufacturing the barium fluoroborate nonlinear optical crystal according to claim 4, wherein the single-phase polycrystalline powder of the barium fluoroborate compound is prepared by a solid-state reaction comprising the steps of:

subjecting a starting material to uniform mixing, grinding, heating at 550° C. for 24 hours in a muffle furnace, and cooling to room temperature to provide a first-processed material;

subjecting the first-processed material to grinding, heating at 650° C. for 24 hours in a muffle furnace, and cooling to room temperature to provide a second-processed material; and subjecting the second-processed material to grinding, heating at 750° C. for 48 hours in a muffle furnace, cooling to room temperature and grinding to provide the single-phase polycrystalline powder of a barium fluoroborate compound, wherein the starting material comprises a barium containing compound, barium fluoride and boric acid at a molar ratio of 7:1:22, respectively, and/or the starting material comprises a barium containing compound, barium fluoride and boric oxide at a molar ratio of 7:1:11, respectively.

6. The method for manufacturing the barium fluoroborate nonlinear optical crystal according to claim 4, wherein the flux of NaF—$H_3BO_3$ has a molar ratio of NaF to $H_3BO_3$ of 1-8:1-5, wherein the flux of $H_3BO_3$—PbO has a molar ratio of $H_3BO_3$ of PbO is 1-6:1-5; and wherein the fluxes of LiF—PbO, NaF—PbO or KF—PbO, have, in each case, a molar ratio of fluoride to lead oxide of 2-5:1-3.

7. A non-linear optical device, comprising a barium fluoroborate nonlinear optical crystal having a chemical formula of $Ba_4B_{11}O_{20}F$, the crystal configured to provide for at least one function selected from the group consisting of: a second harmonic generator; an up frequency converter; a down frequency converter; and an optical parametric oscillator.

8. The barium fluoroborate nonlinear optical crystal of claim 3, wherein the crystal has no symmetric center; belongs to an orthorhombic crystal system; has a space group $Cmc2_1$ with unit cell parameters of a=18.802(3) Å, b=10.7143(19) Å, c=8.6113(14) Å, Z=4, V=1734.7(5) Å$^3$; and a molecular weight of 1007.27.

9. The non-linear optical device of claim 7, comprising a laser, wherein the barium fluoroborate nonlinear optical crystal provides for converting the wavelength of the laser to a new wavelength.

10. The non-linear optical device of claim 9, wherein the laser comprises a Q-switched Nd:YAG laser generator configured to irradiate the barium fluoroborate nonlinear optical crystal with infrared light of wavelength 1064 nm, to provide for generating green second harmonic light with a wavelength of 532 nm.

11. The laser of claim 10, wherein the generated green second harmonic light with a wavelength of 532 nm has an output intensity of 10 times that of $KH_2PO_4$ (KDP) under the same condition.

12. The method of claim 4, wherein, in step c, introducing the seed crystal into the crystal growing furnace comprises introducing the seed crystal from the top of the crystal growing furnace.

* * * * *

UNITED STATES PATENT AND TRADEMARK OFFICE
CERTIFICATE OF CORRECTION

PATENT NO. : 8,545,785 B2
APPLICATION NO. : 13/383797
DATED : October 1, 2013
INVENTOR(S) : Shilie Pan et al.

It is certified that error appears in the above-identified patent and that said Letters Patent is hereby corrected as shown below:

On the title page

At page 1, item (73), Assignee:

The XInjiang Technical Institute Of Physics & Chemistry, Chinese Academy of Sciences Should read as:

The Xinjiang Technical Institute of Physics & Chemistry, Chinese Academy of Sciences Signed and Sealed this
Eighteenth Day of August, 2015

Michelle K. Lee
*Director of the United States Patent and Trademark Office*